United States Patent
Brucker

(10) Patent No.: US 7,403,130 B2
(45) Date of Patent: Jul. 22, 2008

(54) REMOVING AN AUTOMATIC CIRCUIT RECLOSER FROM SERVICE PRIOR TO BATTERY FAILURE

(75) Inventor: David Stephen Brucker, El Paso de Robles, CA (US)

(73) Assignee: Cooper Technologies Company, Houston, TX (US)

( * ) Notice: Subject to any disclaimer, the term of this patent is extended or adjusted under 35 U.S.C. 154(b) by 909 days.

(21) Appl. No.: 10/922,159

(22) Filed: Aug. 20, 2004

(65) Prior Publication Data

US 2006/0039094 A1 Feb. 23, 2006

(51) Int. Cl.
*G08B 21/00* (2006.01)

(52) U.S. Cl. ............................ 340/636.15; 340/636.1; 340/636.19; 340/664; 361/71; 361/93.4; 200/38 F

(58) Field of Classification Search ............ 340/636.15, 340/636.1, 636.19, 664; 361/71, 93.4; 200/38 F
See application file for complete search history.

(56) References Cited

U.S. PATENT DOCUMENTS

| | | | |
|---|---|---|---|
| 4,535,409 A | 8/1985 | Jindrick et al. | |
| 4,931,896 A | 6/1990 | LeCourt | |
| 5,245,498 A | * 9/1993 | Uchida et al. | ................. 361/47 |
| 5,452,172 A | * 9/1995 | Lane et al. | .................... 361/71 |
| 2002/0121901 A1 | 9/2002 | Hoffman | |

OTHER PUBLICATIONS

PCT Written Opinion of the International Searching Authority (Application No. PCT/US2005/029695), mailed Dec. 23, 2005, 5 total pages.
PCT International Search Report (Application No. PCT/US2005/029695), mailed Dec. 23, 2005, 3 total pages.
"Kyle® Form 6 Microprocessor-Based Recloser Controls for Pole, Rack, and Yard Mount Applications Frequently Asked Questions," Cooper Power Systems, Nov. 2001, pp. 1-16.
"Reclosers—Form 6 Microprocessor-Based Pole Mount Recloser Control Installation and Operation Instructions," Cooper Power Systems, S280-70-3, May 2002, pp. 1-44.
"Reclosers—Kyle® Form 6 Microprocessor-Based Recloser Control Programming Guide," Cooper Power Systems, S280-70-4, Sep. 2003, pp. 1-1 thru 2-52.

* cited by examiner

*Primary Examiner*—Phung Nguyen
(74) *Attorney, Agent, or Firm*—Fish & Richardson P.C.

(57) ABSTRACT

An automatic circuit recloser is automatically removed from service prior to battery failure. Logic implemented on the automatic circuit recloser is used to determine whether a battery of the automatic circuit recloser may power operation of the automatic circuit recloser in place of a primary power source of the automatic circuit recloser is determined. The logic is also used to signal for the automatic circuit recloser to be automatically tripped when the battery may not power operation of the automatic circuit recloser in place of the primary power source. The logic also may be used to determine whether the battery is of a marginal quality in which the capability of the battery to power operation of the automatic circuit recloser is compromised, and to issue an alarm to indicate that the battery is of the marginal quality.

46 Claims, 8 Drawing Sheets

REMOVING AN AUTOMATIC CIRCUIT RECLOSER FROM SERVICE PRIOR TO BATTERY FAILURE

TECHNICAL FIELD

This document relates to automatically removing an automatic circuit recloser from service prior to failure of a backup battery.

BACKGROUND

Automatic circuit reclosers (ACR), or reclosers, are protective devices located in electrical substations and transmission circuits that respond to defined abnormal operating conditions caused by overcurrents, or faults. Reclosers trip open in programmed response to faults to limit the duration of the faults and corresponding exposure to dangerously high voltages and arcing, both of which may cause personnel injury and property and environmental damage. Reclosers use microprocessor controls to provide fault sensing and corrective logic that remove the source of electrical energy flowing to the fault by causing the recloser to open or trip.

A conventional recloser is powered by electrical energy from a low voltage power source that receives power from the electrical substation or transmission circuit being protected. An electrical battery is provided as a secondary source of power for the microprocessor control in the event that the power source fails. The battery is charged by the power source, and is subject to aging effects and eventual failure. When the recloser has a low or marginal quality battery, and when the power source fails, the control stops functioning after the battery supply voltage falls below a certain minimum value. In such a case, the control does not provide any logic to trip or open the recloser should a fault occur, which may result in the potentially damaging and injurious fault persisting for the time necessary for a backup device to operate and remove the source of electrical power for the fault.

Typically, utility personnel manually test the condition of the battery before applying a hot line or a non-reclosing tag and commencing hot line work. The results of the test are manually interpreted to determine whether the hot line work may proceed in a safe manner, and the interpretation of the results may vary among utility companies and among crews within the utility companies. Once testing is complete, the personnel may move away from the recloser to perform the hot line work. As such, the personnel may not be in a position to observe the loss of power to the recloser and/or the failure of the battery, and to respond by stopping the hot line work. In addition, the personnel may be in a location at which they may not receive radio communications indicating that power has been lost and/or the battery has failed.

SUMMARY

In one general aspect, an automatic circuit recloser is removed from service prior to battery failure. Logic implemented on the automatic circuit recloser is used to determine whether a battery of the automatic circuit recloser may power operation of the automatic circuit recloser in place of a primary power source of the automatic circuit recloser. The logic is also used to signal for the automatic circuit recloser to be automatically tripped when the battery may not power operation of the automatic circuit recloser in place of the primary power source.

Implementations may include one or more of the following features. For example, determining whether the battery may power operation of the automatic circuit recloser may include calculating a compensated voltage for the battery. The compensated voltage may be compared to a trip voltage that represents the compensated voltage at or below which the battery may not power operation of the automatic circuit recloser, and a determination that the battery may not power operation of the automatic circuit recloser may be made when the compensated voltage for the battery is less than the trip voltage.

Calculating the compensated voltage for the battery may include measuring a voltage and an internal voltage drop for the battery. The measured internal voltage drop may be multiplied by a compensated voltage constant to produce a compensation factor that may be subtracted from the measured voltage to produce the compensated voltage. Subtracting the compensation factor from the measured voltage may include raising the compensation factor to a whole number power to produce a raised compensation factor, and subtracting the raised compensation factor from the measured voltage to produce the compensated voltage.

Subtracting the compensation factor from the measured voltage also may include adding an ambient temperature correction factor to the compensation factor to produce a temperature corrected compensation factor. The temperature corrected compensation factor may be raised to a whole number power to produce a raised compensation factor that may be subtracted from the measured voltage to produce the compensated voltage. The ambient temperature correction factor may be determined using the logic based on an ambient temperature to which the automatic circuit recloser is exposed.

The logic may be used to wait for a trip delay amount of time after determining that the battery may not power operation of the automatic circuit recloser and before signaling for the automatic circuit recloser to be tripped.

The logic may be used to determine whether the battery is of a marginal quality in which the capability of the battery to power operation of the automatic circuit recloser is compromised. The logic may be used to issue an alarm to indicate that the battery is of the marginal quality.

Determining whether the battery is of the marginal quality may include calculating a compensated voltage for the battery. The compensated voltage may be compared to an alarm voltage that indicates a compensated voltage at or below which an alarm indicating that the battery is of the marginal quality is issued. An alarm may be issued when the compensated voltage is less than the alarm voltage.

The compensated voltage may be compared to an alarm reset voltage that represents a minimum compensated voltage at which an alarm that has been issued is removed using the logic. An alarm that has been issued may be removed when the compensated voltage is greater than the alarm reset voltage using the logic.

The logic may be used to determine whether the automatic circuit recloser is performing a protective action in response to a fault. The logic may prevent an alarm that indicates that the battery is of the marginal quality from being issued when the automatic circuit recloser is performing a protective action in response to a fault. The logic also may prevent a signal for the automatic circuit recloser to be tripped automatically from being issued when the automatic circuit recloser is performing a protective action in response to a fault.

Determining whether the battery may power operation of the automatic circuit recloser may include determining whether a previous determination as to whether the battery may power operation of the automatic circuit recloser has been made at a time within a minimum amount of time between tests of the battery from the present time. Whether the battery may power operation of the automatic circuit recloser may be determined when a previous determination as to whether the battery may power operation of the automatic circuit recloser has not been made at a time within the minimum amount of time between tests of the battery from the present time.

Determining whether the battery may power operation of the automatic circuit recloser may include determining whether a hot line tag or a non-reclosing tag has been applied to the automatic circuit recloser, and determining whether the battery may power operation of the automatic circuit recloser when the hot line tag or the non-reclosing tag has been applied to the automatic circuit recloser.

Determining whether the battery may power operation of the automatic circuit recloser may include determining whether the automatic circuit recloser has been energized, and a time at which the automatic circuit recloser was energized. Whether the battery may power operation of the automatic circuit recloser may be determined when the time at which the automatic circuit recloser was energized is not within a minimum amount of time after recloser energization from the present time.

Determining whether the battery may power operation of the automatic circuit recloser may include determining whether the power source has failed, and whether the power source failed at a time within a power loss time delay from the present time. Whether the battery may power operation of the automatic circuit recloser may be determined when the power source failed at a time that is not within a power loss time delay from the present time.

A quality of the battery may be determined by using the logic to compare measurements of parameters that describe the quality of the battery to values of the parameters that are indicative of a good quality battery. The logic may be used to signal for the display of information describing the quality to an operator of the automatic circuit recloser.

Signaling for the display of information describing the quality may include identifying a text message describing the quality of the battery, and signaling for the display of the text message on a liquid crystal display screen that is viewed by the operator. The logic may be used to signal for the liquid crystal display screen to be refreshed when a new text message to be displayed is identified. Signaling for the display of information describing the quality may include lighting one or more light emitting diodes to indicate the quality of the battery to the operator.

The logic implemented on the automatic circuit recloser is included in a scratch logic portion or a base logic portion of the recloser. The automatic circuit recloser may be connected to a transmission circuit or an electrical substation.

These general and specific aspects may be implemented using a system, a method, or a computer program, or any combination of systems, methods, and computer programs.

In one implementation of the described techniques, a battery of an automatic circuit recloser is automatically tested to determine if the battery may cause the recloser to trip in response to a detected fault. An alarm is generated or a trip signal is issued when the test indicates that the battery is at risk of failing. A test is performed when a hot line or non-reclosing tag is applied to the recloser, periodically at a recurring user-defined interval, or within a short time after the recloser is energized. A battery voltage is measured and compensated with an ambient temperature correction factor and a measurement of the internal voltage drop of the battery. If the compensated battery voltage is sufficiently low, an alarm or trip signal is generated in advance of failure of the battery. In addition, a current condition of the battery is identified and a message describing the current condition of the battery is displayed on a front panel of the recloser.

Automatically testing the battery of the recloser and interpreting the results of the test to generate an alarm or to trip the recloser ensures that the testing is performed and that the results are consistently interpreted among utilities and utility crews. Furthermore, automatically testing the battery eliminates the need to train personnel to test the battery and interpret the results of the test, which consequently reduces the effects of personnel turnover, technical misunderstanding, and personnel forgetfulness on the effectiveness of battery testing. In addition, automatically testing the battery eliminates the need to have personnel at the recloser to perform the test or to observe the loss of power to the recloser or failure of the battery while hot line work is being performed. The utility personnel need not be in a location where radio communications may notify the personnel that the hot-line work is potentially dangerous because the danger is eliminated by tripping the recloser in advance of battery failure. Automatically tripping the recloser in advance of battery failure protects the environment in areas of high fire danger by preventing forest fires or grass fires due to uninterrupted line faults in areas of high risk.

Other features will be apparent from the description and drawings, and from the claims.

DESCRIPTION OF DRAWINGS

Like reference symbols in the various drawings indicate like elements.

DETAILED DESCRIPTION

Figure 1:
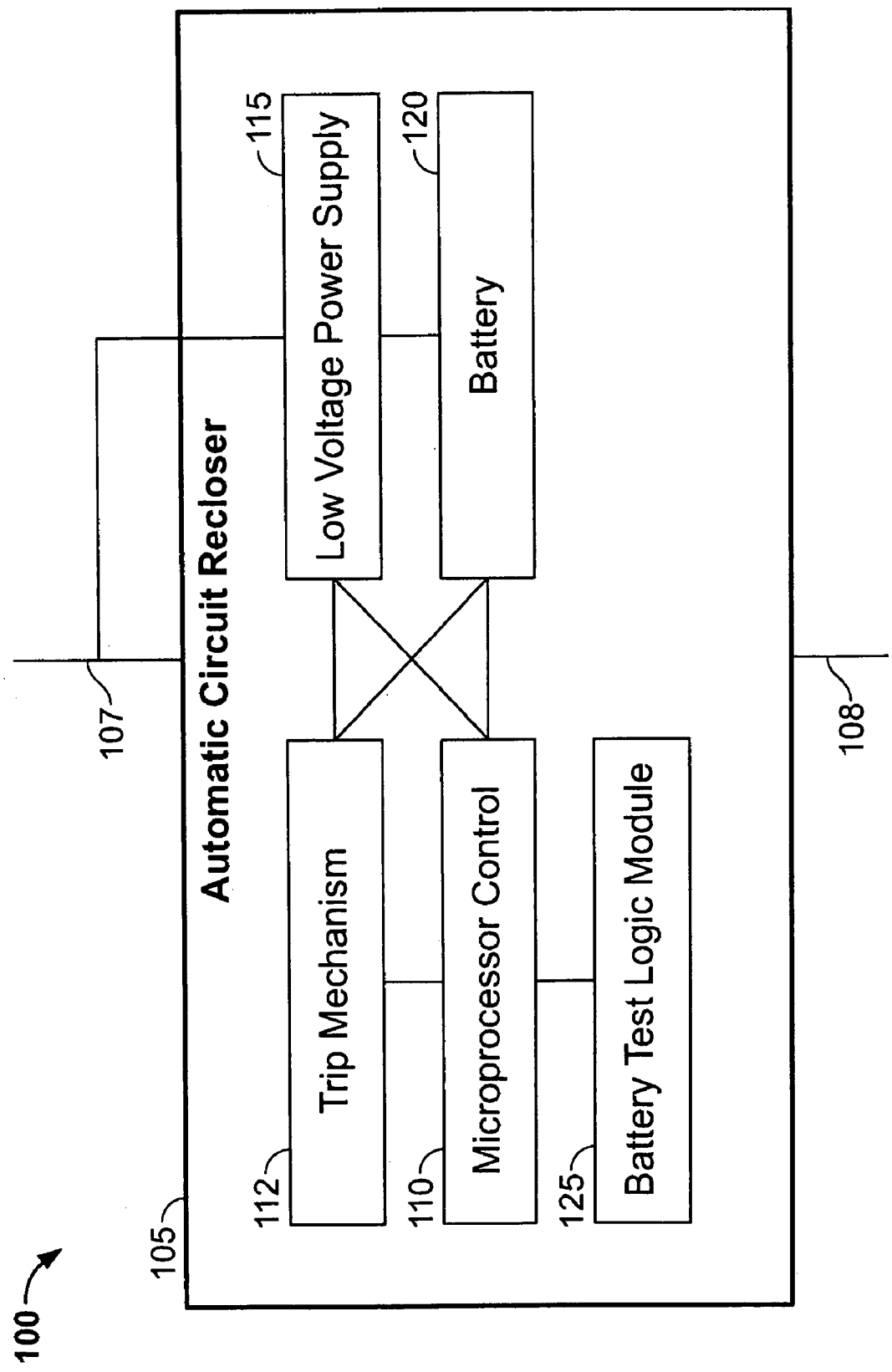
FIG. 1 is a block diagram of an electrical system protected by an automatic circuit recloser with a battery that is periodically tested for quality.

Referring to FIG. 1, an electrical system 100 includes an automatic circuit recloser 105, which is also referred to as a recloser. The recloser 105 is positioned between portions 107 and 108 of a distribution or transmission line and serves to protect components connected to one of the portions 107 and 108 from a fault that occurs on the other one of the portions 107 and 108. The recloser 105 includes a microprocessor control 110 that signals for the recloser 105 to trip open in response to a fault on one of the portions 107 and 108, and a trip mechanism 112 that trips the recloser 105 in response to signals from the microprocessor 110. Operation of the recloser 105 is powered by a low voltage power source 115 and, when the power source 115 fails, by a battery 120. The control 110 executes a battery test logic module 125 to periodically determine whether the battery 120 may power operation of the recloser 105 if the power source 115 fails.

The electrical system 100 may be an electrical substation or a transmission circuit that distributes electricity from the electrical substation. An electrical substation is used to increase the voltage of the electricity to a high value before the electricity is transmitted over a long distance using a transmission circuit or to decrease the voltage to a low value that is more suitable for end user consumption after distribution. The portions 107 and 108 may be portions of the electrical substation. A transmission circuit branches current from an electrical substation in multiple directions such that the electricity from the substation may be distributed over the branches of the transmission circuit. For example, the transmission circuit may connect a distribution substation at a power generation plant that is connected to one of the portions 107 or 108 to multiple power substations directly or indirectly connected to the other one of the portions 107 or 108 at which the electricity is stepped down to a voltage that may be used in normal applications. Similarly, the transmission circuit may connect a power substation that is connected to one of the portions 107 or 108 to multiple end locations directly or indirectly connected to the other one of the portions 107 or 108 at which electricity is consumed.

The recloser 105 is used to protect the electrical system 100 and devices and systems associated with the electrical system 100 from damage due to faults on one of the portions 107 or 108. Examples of faults include voltages and currents that are significantly larger than normal operating voltages and currents of the electrical system 100. More particularly, the recloser trips open when a fault is detected on one of the portions 107 or 108, which causes the other one of the portions 107 or 108 to be de-energized. For example, when a fault is detected on the portion 107, the recloser 105 trips open to de-energize the portion 108, and vice versa. De-energizing one of the portions 107 or 108 prevents the effects of the fault from being transferred through the electrical system 100. In other words, tripping the recloser 105 when a fault is detected on the portion 107 prevents the effects of the fault from being transferred to the portion 108, and vice versa. The recloser 105 is connected in series with the portions 107 and 108 such that current flowing through the portions 107 and 108 also flows through the recloser 105. For example, current may flow through the recloser 105 from the portion 107 to the portion 108 or from the portion 108 to the portion 107. In order to de-energize the portions 107 and 108, the recloser 105 prevents current from flowing through the recloser 105.

The control 110 executes corrective logic to cause the recloser 105 to trip in response to a fault on one of the portions 107 or 108. More particularly, execution of the corrective logic may cause the control 110 to issue a signal to trip the recloser 105. This signal is received by the trip mechanism 112, which then trips the recloser 105. In other words, the trip mechanism 112 breaks the series connection between the portions 107 and 108 and the recloser 105 in response to the signal from the control 110, which prevents current from flowing between the portions 107 and 108, and the effects of corresponding faults from being transferred between the portions 107 and 108.

The operation of the control 110 and the trip mechanism 112 are powered by the power source 115 and, when the power source 115 has failed, by the battery 120. The control 110 and the trip mechanism 112 require a minimum amount of current and voltage from either the power source 115 or the battery 120 to trip the recloser 105. If the minimum amount of current and voltage are not provided to the control 110, then the recloser 105 may not be tripped.

The power source 115 receives power from the electrical system 100 that is being protected by the recloser 105. For example, if power is flowing from the portion 107 to the portion 108, the power source 115 receives power from the portion 107, as illustrated in FIG. 1. The power source 115 steps down the typically high voltages of the portions 107 and 108 to voltages that are more suitable for use by the control 110. The power source 115 also recharges the battery 120 when operational. After the power source 115 fails, the battery 120 is no longer recharged, so the voltage of the battery 120 decreases as the battery 120 powers operation of the recloser. In one implementation, the battery 120 is a minimum lead-acid gel battery.

An electrochemical reaction within the battery 120 produces electrons that may be used to power the operation of the recloser 105. The number of electrons produced by the electrochemical reaction is directly related to the voltage of the battery 120. As the battery 120 becomes older, the speed of the electrochemical reaction within the battery 120 decreases, so fewer electrons are produced, and the voltage of the battery 120 is consequently reduced. The electrochemical reaction causes an originally pure lead plated structure within the battery 120 to become impure, which increases the internal resistance of the battery 120. The increased internal resistance prevents the battery 120 from holding a charge above a voltage that is related to the purity of the lead plated structure. In other words, the increased internal resistance results in a decreased battery voltage. When the voltage of the battery 120 has decreased to a particular point, the battery 120 is no longer capable of generating a current that is sufficient to power the operation of the recloser 105.

The battery test logic module 125 is executed by the control 110 to cause the battery 120 to be tested to determine if the battery 120 may power the operation of the recloser 105 in the event of failure of the power source. The battery test logic module 125 tests the battery 120 when a hot line tag or a non-reclosing tag is applied to the recloser 105, periodically at a recurring user-defined interval, or within a short time after the recloser 105 is energized. If power to the recloser 105 has been lost, the battery test logic module 125 issues an alarm when the voltage of the battery 120 drops to a level at which the battery 120 may still power the operation of the recloser 105 but only marginally so. If power to the recloser 105 is not restored, and the voltage continues to drop to a level at which the battery 120 may not power the operation of the recloser 105 to prevent damage from faults, the battery test logic module 125 issues a signal to trip the recloser 105. The battery test logic module 125 also may lock out the recloser 105 to prevent the recloser 105 from being reclosed before power is restored or the battery 120 is serviced. Information describing the condition of the battery 120 may be communicated by the battery test logic module 125 with a series of light emitting diodes (LEDs) and text messages displayed on a liquid crystal display (LCD) of the recloser 105.

Logic illustrated in FIGS. 2-9 represents portions of the battery test logic module 125 executed to test the battery 120 and take appropriate action based on the test of the battery. The logic illustrated in FIGS. 2-9 may be implemented on a scratch logic or a base logic portion of the recloser 105.

Figure 2:
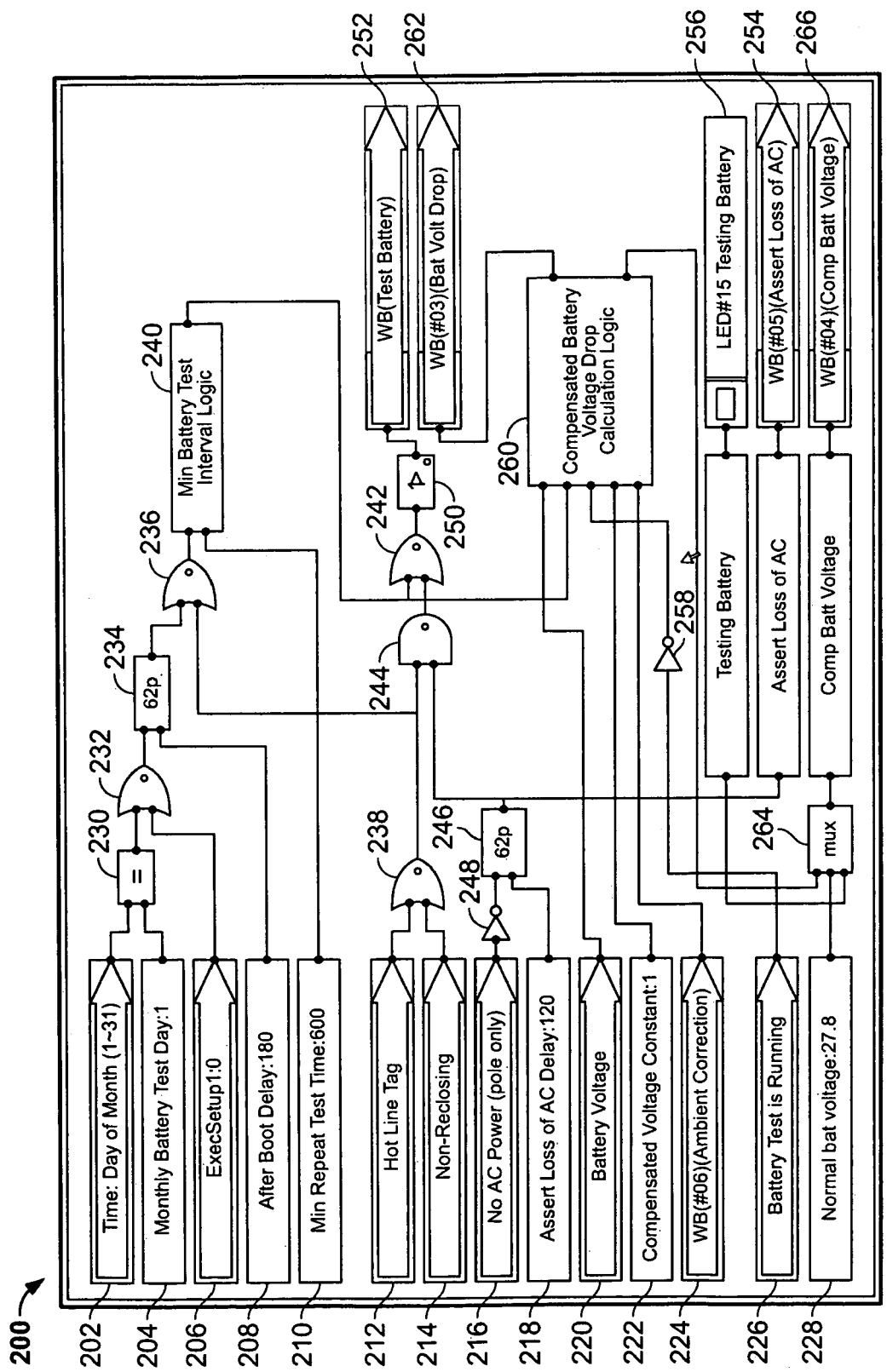
FIG. 2 is a block diagram of a logic module for identifying when a battery of a recloser should be tested.

Referring to FIG. 2, a battery test identification logic module 200 identifies when a battery used by an automatic circuit recloser is tested to determine if the battery may fail in the near future. The battery test identification logic module 200 is a portion of the battery test logic module 125 of FIG. 1. The battery test identification logic module 200 signals for a test of the battery at regular intervals and limits testing of the battery to one test during each interval. The battery test identification logic module 200 also ensures that the automatic circuit recloser is in a state in which the battery may be safely and accurately tested. The battery test identification logic module 200 tests various characteristics of the battery and the recloser to determine if the battery may fail soon.

The battery test identification logic module 200 receives as inputs a time 202 that indicates a current time and a test time 204 that indicates a time at which the battery is tested. The battery may be tested when the time 202 equals the test time 204. In one implementation, the time 202 indicates a day of the current month, and the test time 204 indicates a day of the month on which the battery is to be tested. In another implementation, the time 202 indicates a day of the current week, and the test time 204 indicates a day of the week on which the battery is to be tested. In yet another implementation, the time 202 indicates a time in the current day, and the test time 204 indicates a time of the day at which the battery is to be tested. The time 202 and the test time 204 may indicate other times within time periods at which the battery may be tested. In the illustrated implementation, the test time 204 has a value of 1, which indicates that the battery is to be tested on the first day of each month.

The battery test identification logic module 200 also receives an energization signal 206 that is asserted when the recloser is energized, an after boot delay 208 that specifies a minimum amount of time after the recloser is energized before the battery may be tested, and a minimum repeat test time 210 that specifies a minimum allowable amount of time between tests of the battery. In one implementation, the after boot delay 208 has a value of 180 seconds, and the minimum repeat test time 210 has a value of 600 seconds. In certain implementations, the minimum repeat test time 210 is a user configurable parameter that may vary between 300 second and 1200 seconds. The battery test identification logic module 200 also includes a hot line tag input 212 that is asserted when a hot line tag is applied to the recloser, and a non-reclosing input 214 that is asserted when the recloser is specified as non-reclosing.

The battery test identification logic module 200 also receives as an input a power loss input 216 that is not asserted when power to the recloser has been lost and the recloser is relying on the battery for power. A power loss time delay 218 indicates a minimum amount of time for which the power loss input 216 must be unasserted before asserting that power to the recloser has been lost. In one implementation, the power loss time delay 218 is a user configurable parameter that may vary between 60 seconds and 180 seconds and has been assigned a value of 120 seconds.

A battery voltage 220 indicates the voltage of the battery. A compensated voltage constant 222 and an ambient temperature correction factor 224 are used to calculate the compensated voltage for the battery. In one implementation, the compensated voltage constant 222 is 1. A running battery test input 226 is asserted when the battery is being tested. A normal battery voltage 228 indicates a normal operating voltage for the battery, which is 27.8 V in one implementation.

The time 202 and the test time 204 serve as the inputs to an equality operator 230 that is asserted when the time 202 equals the test time 204. The output of the equality operator 230 serves as an input to an OR gate 232. Since the second input to the OR gate is the energization signal 206, the output of the OR gate 232 is asserted when the recloser is energized or when the current time is the time at which the battery is tested. The output of the OR gate 232 is sent to a pickup timer 234, the output of which is asserted after the output of the OR gate 232 has been asserted for at least an amount of time equal to the after boot delay 208. The output of the pickup timer 234 is passed to another OR gate 236, the second input of which is the output of an OR gate 238. The OR gate 238 takes the hot line tag input 212 and the non-reclosing input 214 as inputs to produce an output that is asserted when conditions required for a test of the battery are satisfied. The output of the OR gate 236 is passed to a minimum battery test interval logic module 240 that also receives the minimum repeat test time 210.

Figure 3:
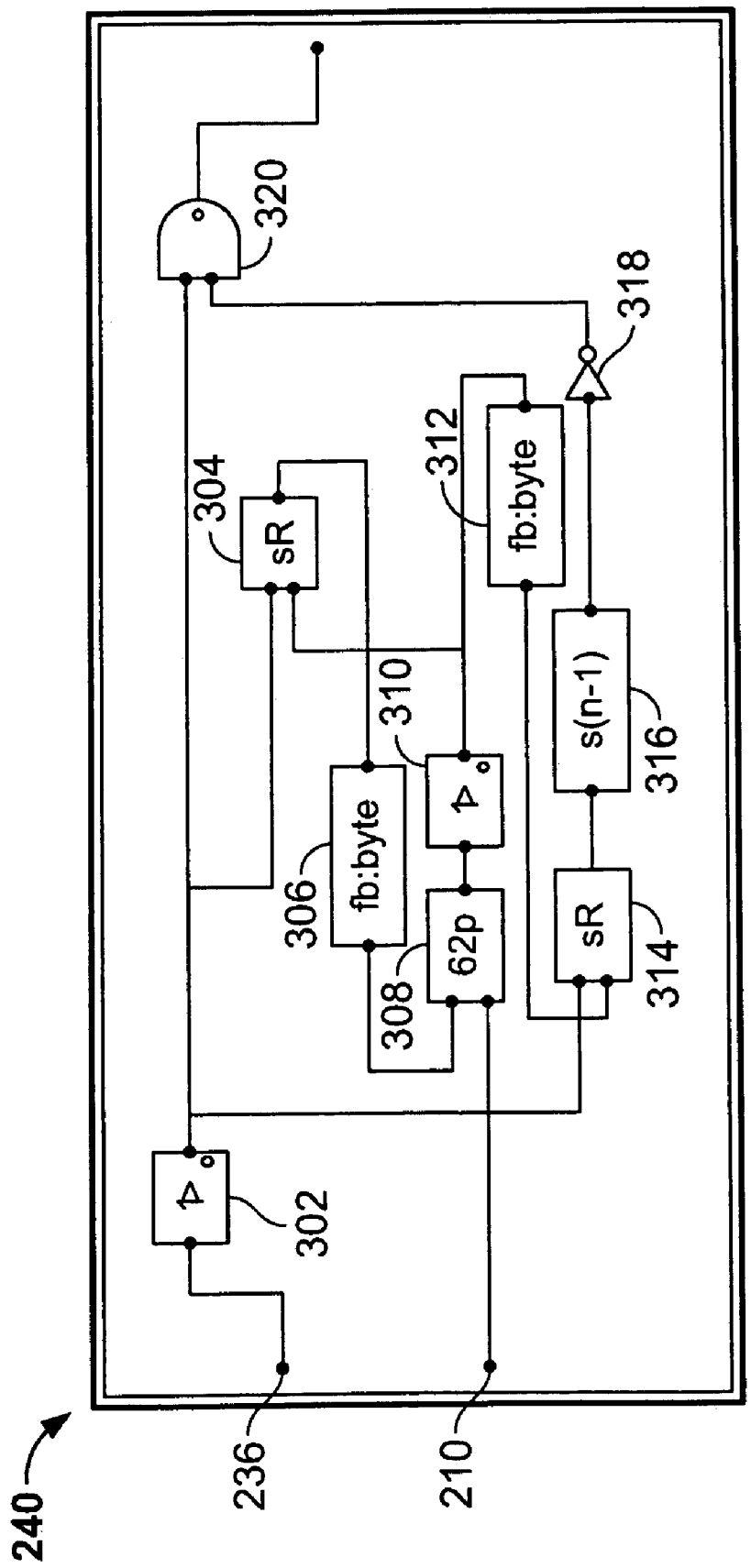
FIG. 3 is a block diagram of a logic module for limiting the frequency of tests of a recloser battery.

Referring also to FIG. 3, the minimum battery test interval logic module 240 includes logical operators for limiting the frequency of battery tests. The minimum battery test logic module 240 indicates that the battery should be tested only after an amount of time equal to the minimum repeat test time 210 has passed since the last test of the battery. The output of the OR gate 236 is passed to an edge detector 302 that is asserted when the output of the OR gate 236 becomes asserted, which is when a battery test may be performed. The output of the edge detector 302 is used to set a non-volatile memory module 304 that outputs an asserted signal after the output of the edge detector 302 is asserted. The output of the memory module 304 persistently indicates that a test of the battery may be performed. A feedback block 306 feeds the output of the non-volatile memory module 304 back to a pickup timer 308. The feedback block 306 is necessary because the pickup timer 308 otherwise processes before the memory module 304, and consequently cannot use the output of the memory module 304. The second input to the pickup timer 308 is the minimum repeat test time 210, which indicates the amount of time after the output of the non-volatile memory module 304 is asserted before the output of the pickup timer 308 is asserted. Therefore, output of the pickup timer 308 is asserted when the amount of time indicated by the minimum repeat test time 210 has passed since the last time at which a signal to test the battery was issued. The output of the pickup timer 308 is passed to an edge detector 310 that is similar to the edge detector 302.

The output of the edge detector 310 is used as a reset signal for the memory module 304. When the output of the edge detector 310 is asserted, the output of the non-volatile memory module 304 is reset to be unasserted.

The output of the edge detector 310 also is passed to a feedback block 312 that provides the output of the edge detector 310 as a reset input to a non-volatile memory module 314. The feedback block 312 is necessary because the memory module 314 otherwise processes before the edge detector 310, and consequently cannot use the output of the edge detector 310. The set input to the memory module 314 is the output of the edge detector 302. As a result, when the output of the edge detector 302 is asserted, the output of the memory module 314 is asserted until an asserted output from the feedback block 312 is received on the lower input of the memory module 314. Therefore, output of the memory module 314 is unasserted when at least the amount of time indicated by the minimum repeat test time 210 has passed since the last test of the battery.

The output of memory module 314 is passed to a delay block 316 that produces a delayed version of that signal as the output of the delay block 316. In particular, the output of the delay block 316 matches the output of memory module 314 one processing cycle after the signal is received on the input to the delay block 316. In one implementation, a processing cycle has a length of one to two milliseconds.

The output of the delay block 316 is passed through a NOT gate 318, and the output of the NOT gate 318 is passed to an AND gate 320. The output of the NOT gate 318 is asserted when at least the amount of time indicated by the minimum repeat test time 210 has passed since the last test of the battery. Since the second input to the AND gate 320 is the output of the edge detector 302, the output of the AND gate 320 and, consequently, of the minimum battery test interval logic 240, is asserted when a test of the battery may be performed and a test of the battery has not been performed within the amount of time indicated by the minimum repeat test time 210.

When a test of the battery has not been performed within the amount of time indicated by the minimum repeat test time 210, the memory module 314 has an unasserted output, and the NOT gate 318 has an asserted output. When the output of the edge detector 302 subsequently becomes asserted, the AND gate 320 becomes asserted until the NOT gate 318 becomes unasserted as a result of the memory module 314 becoming asserted. The delay block 316 ensures that the AND gate 320 becomes asserted in such a case by providing additional time between when the output of the edge detector 302 becomes asserted and when the output of the NOT gate 318 becomes unasserted for the AND gate 320 to become asserted and signal for a test of the battery.

Referring again to FIG. 2, the output of the minimum battery test interval logic 240 is passed to an OR gate 242. The second input of the OR gate 242 comes from an AND gate 244. One input of the AND gate 244 is the output of the OR gate 238, and the second input to the AND gate 244 is the output of a pickup timer 246. The pickup timer 246 is asserted only after the output of a NOT gate 248 has been asserted for longer than an amount of time indicated by the power loss time delay 218. Because the input to the NOT gate 248 is the power loss input 218, the output of the pickup timer 246 is asserted when power to the recloser has been lost for longer than the amount of time indicated by the power loss time delay 218. Consequently, the AND gate 244 is asserted when both power to the recloser has been lost for the requisite amount of time and one of the hot line tag input 212 or the non-reclosing input 214 is asserted, in which case the battery should be immediately tested. The output of the OR gate 242 passes through an edge detector 250, the output of which is asserted when the output of the OR gate 242 transitions to the asserted state. The output of the edge detector 250 is used to set a variable 252 that indicates that the battery is to be tested.

In general, the battery test identification logic module 200 signals for a battery test when certain conditions are satisfied. For example, the battery may be tested on a particular day of each month or week, at a particular time of each day, after the recloser is energized, or after a hot line tag or a non-reclosing tag has been applied to the recloser. However, the battery test identification logic module 200 may include additional logic that prevents tests of the battery even when one or more of the above conditions are satisfied. For example, the battery test identification logic module 200 may include logic that prevents the variable 252 from being asserted when the recloser is taking protective action against a fault that has occurred, because testing the battery while the recloser is taking protective action may draw power away from components of the recloser that need the power to perform the protective action. Preventing the variable 252 from being asserted while protective action is being taken may prevent future tests of the battery that may be scheduled to occur before the fault has been cleared. Preventing the variable 252 from being asserted also may interrupt and cancel a test of the battery that is in process when the protective action is started.

The output of the pickup timer 246 is also used to set a variable 254 that indicates that power to the recloser has been lost. The running battery test input 226 drives a LED 256 that is lit when the running battery test input 226 is asserted, or, in other words, when the battery is being tested. The running battery test input 226 is passed through a NOT gate 258, the output of which is passed as an input to a compensated battery voltage drop calculation logic module 260 along with the battery voltage 220, the output of the minimum battery test interval logic module 240, the compensated voltage constant 222, and the ambient temperature correction factor 224.

The compensated battery voltage drop calculation logic module 260 calculates the compensated voltage of the battery. In general, the remaining life of the battery is directly proportional to the compensated battery voltage. The compensated battery voltage accounts for multiple factors, such as battery voltage, internal battery voltage drop, and ambient temperature, that affect the amount of remaining life of the battery. The internal battery voltage drop is the difference between the battery voltage 220 at the beginning and at the end of a test of the battery. The voltage at the end of the test is different from the voltage at the beginning of the test because electrical charge stored within the battery is used during the test. In general, the remaining life of the battery is inversely proportional to the internal voltage drop of the battery. For example, an internal voltage drop of between 1 V and 1.5 V indicates that the battery has a relatively large amount of life remaining, while an internal voltage drop of 3 V or more indicates that the battery has a relative small amount of life remaining. The measured internal voltage drop is used to derive an added voltage drop that is subtracted from the battery voltage to anticipate the collapse of the battery voltage as the voltage declines during a discharge cycle unsupported by alternating current (AC) recharging of the battery.

Figure 4:
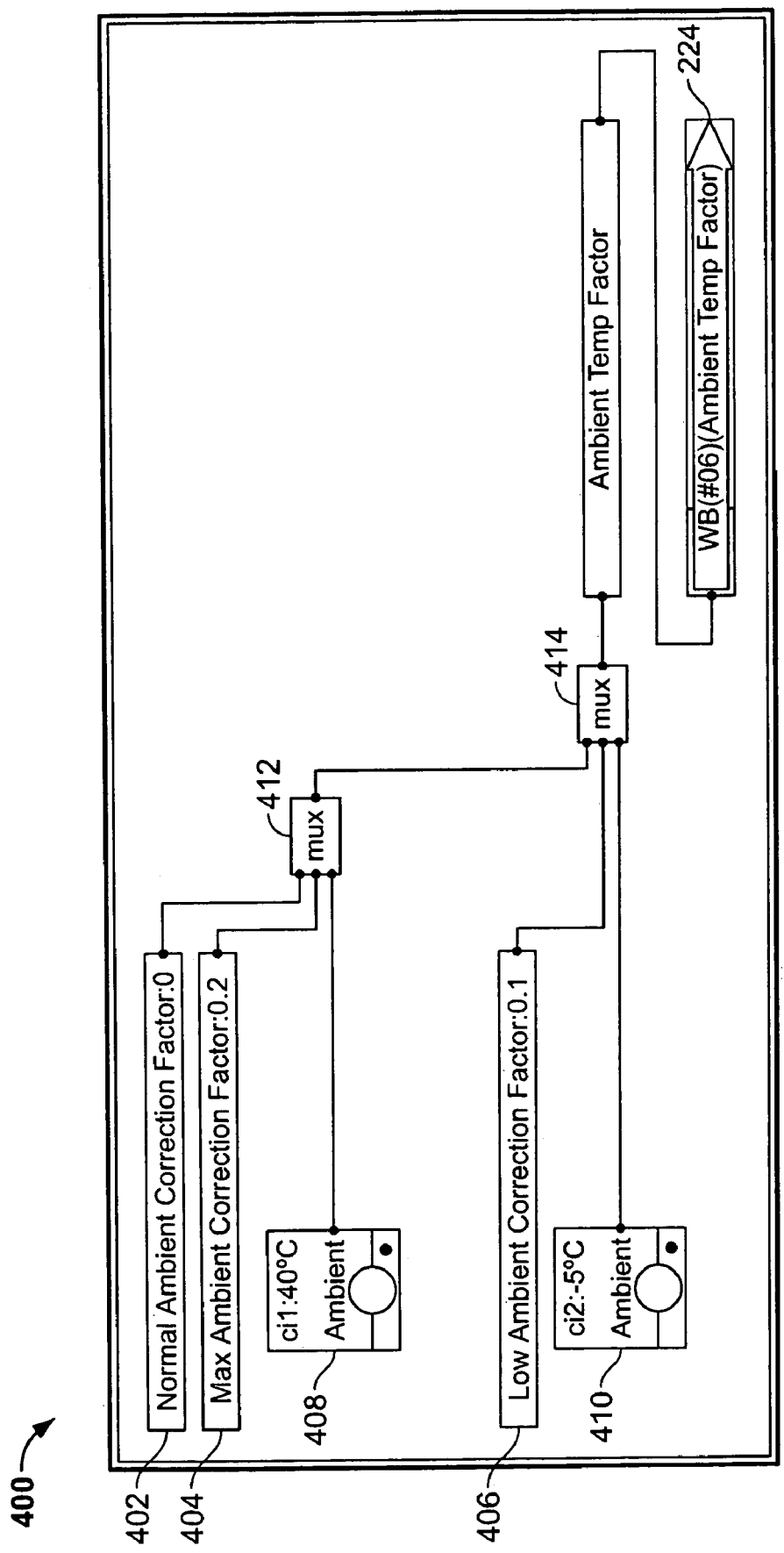
FIG. 4 is a block diagram of a logic module for identifying an ambient temperature correction factor for use in a test of a recloser battery.

Battery voltage temperature compensation is accomplished by adding or subtracting a voltage drop proportional to an analog value that represents the ambient temperature. However, the recloser may not include provisions for directly measuring the ambient temperature. Referring also to FIG. 4, a battery voltage temperature compensation logic module 400 may be used in such cases to accomplish battery voltage temperature compensation. The battery voltage temperature compensation logic module 400 uses external temperature switches that open or close upon reaching characteristic temperatures. The positions of the switches may be passed to the recloser and to the battery voltage temperature compensation logic module 400 using programmable inputs to the recloser. The collective positions of the temperature switches indicate whether the recloser is exposed to high, normal, or low ambient temperatures, which determines the ambient temperature correction factor 224.

The battery voltage temperature compensation logic module 400 includes three correction factor inputs 402-406 that specify ambient temperature correction factors. For example, the normal ambient temperature correction factor 402 indicates the ambient temperature correction factor to be used when the recloser is exposed to a normal ambient temperature. The maximum ambient temperature correction factor 404 indicates the ambient temperature correction factor to be used when the recloser is exposed to a high ambient temperature, and the low ambient temperature correction factor 406 indicates the ambient temperature correction factor to be used when the recloser is exposed to a low ambient temperature. In one implementation, the normal ambient temperature correction factor 402 has a value of 0, the maximum ambient temperature correction factor 404 has a value of 0.2, and the low ambient temperature correction factor 406 has a value of 0.1.

The battery voltage temperature compensation logic module 400 also receives signals from two ambient temperature switches 408 and 410. Each of the ambient temperature switches 408 and 410 has a characteristic temperature. In one implementation, the temperature switch 408 has a characteristic temperature of 40° C., and the temperature switch 410 has a characteristic temperature of −5° C. The ambient temperature switch 408 outputs an asserted signal when the ambient temperature is greater than or equal to 40° C., and outputs an unasserted signal otherwise. By contrast, the ambient temperature switch 410 outputs an asserted signal when the ambient temperature is less than or equal to −5° C., and outputs an unasserted signal otherwise.

The normal ambient temperature correction factor 402 and the maximum ambient temperature correction factor input 404 are passed to a multiplexing device 412, along with the signal from the temperature switch 408. The output of the multiplexing device 412 equals the normal ambient temperature correction factor 402 when the signal from the temperature switch 408 is not asserted and the maximum ambient temperature correction factor 404 when the signal from the temperature switch 408 is asserted. The output of the multiplexing device 412 and the low ambient temperature correction factor 406 are passed to another multiplexing device 414, along with the signal from the temperature switch 410. The output of the multiplexing device 414 equals the output of the multiplexing device 412 if the signal from the temperature switch 410 is not asserted and the low ambient temperature correction factor 406 if the signal from the temperature switch 410 is asserted. The output of the multiplexing device 414 is used to set the ambient temperature correction factor 224, which represents an appropriate ambient temperature correction factor for the ambient temperature range indicated by the temperature switches 408 and 410.

The compensated battery voltage may be calculated in multiple ways using the battery voltage 220, the internal battery voltage drop, the compensated voltage constant 222, and the ambient temperature correction factor 224. In one implementation, the compensated battery voltage drop calculation logic module 260 calculates the compensated battery voltage by compensating the battery voltage 220 by a fraction of the internal voltage drop of the battery. In another implementation, the battery voltage 220 is compensated by a fraction of the internal voltage drop taken to a whole number power. In another implementation, the compensated battery voltage is calculated by compensating the battery voltage 220 by a fraction of the internal voltage drop and the ambient temperature correction factor 224, the sum of which is taken to a whole number power. The appropriate method for calculating the compensated battery voltage is chosen to mimic voltage discharge curves of the battery type and manufacturer used.

Figure 5:
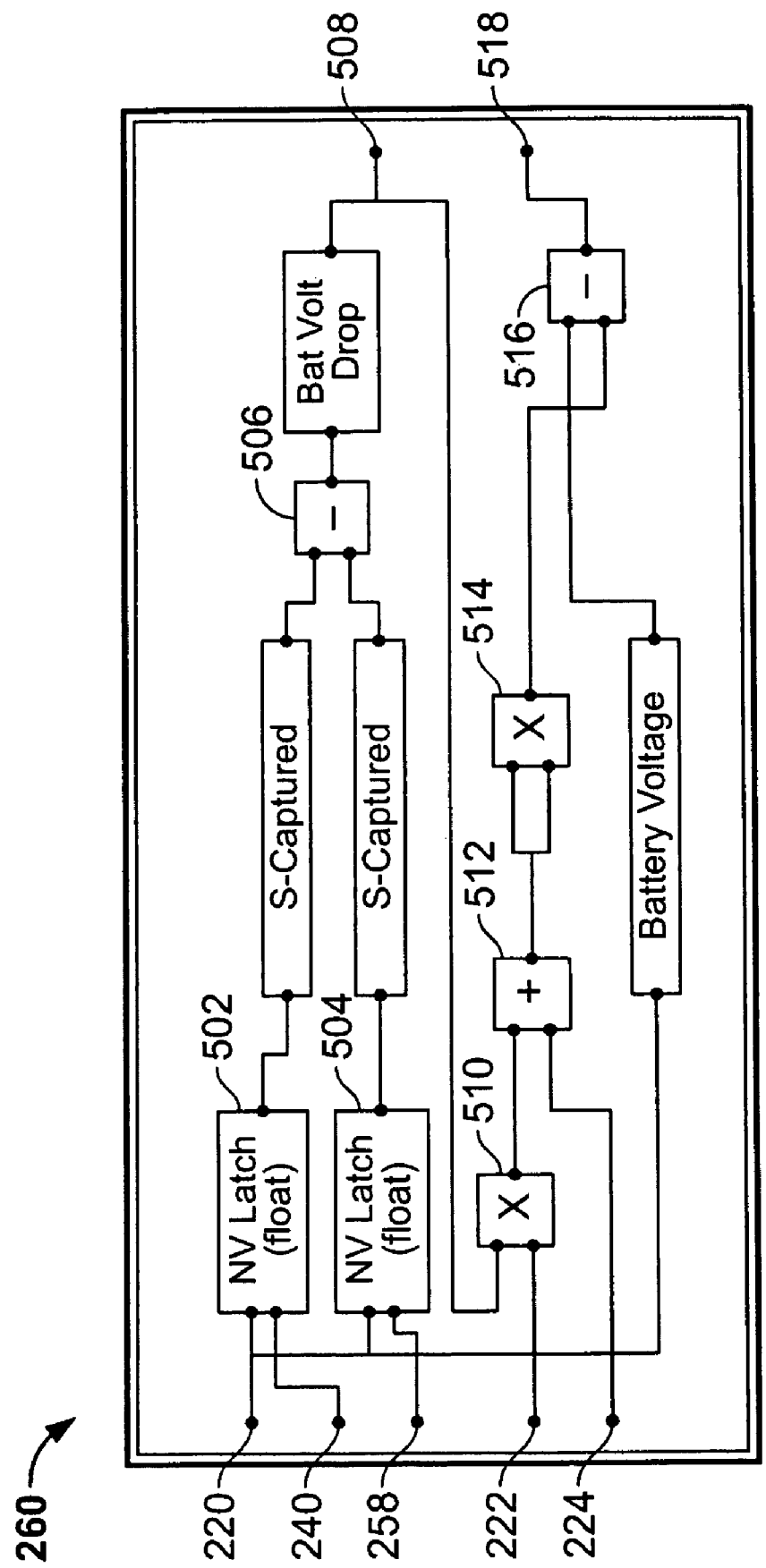
FIG. 5 is a block diagram of a logic module for calculating a compensated battery voltage of a recloser battery.

Referring also to FIG. 5, one implementation of the compensated battery voltage drop calculation logic module 260 calculates the compensated battery voltage by compensating the battery voltage 220 by a fraction of the internal voltage drop and the ambient temperature correction factor 224, the sum of which is taken to the second power (i.e., squared). The battery voltage 220 is passed to two non-volatile latches 502 and 504. The non-volatile latch 502 captures and places on an output the battery voltage 220 when the output of the minimum battery test logic interval logic module 240 becomes asserted. In other words, the non-volatile latch 502 captures the battery voltage 220 when a signal for a battery test is received at the beginning of the battery test. Similarly, the non-volatile latch 504 captures and places on an output the battery voltage 220 when the output of the NOT gate 258 becomes asserted. The NOT gate 258 becomes asserted at the end of a battery test, so the non-volatile latch 504 captures the battery voltage 220 at the end of a battery test. A subtraction block 506 subtracts the voltage captured by the non-volatile latch 504 from the voltage captured by the non-volatile latch 502 to provide the internal battery voltage drop as the output of the subtraction block 506. The internal battery voltage drop is provided as an upper output 508 of the compensated battery voltage drop calculation logic module 260.

The internal battery voltage drop also is provided to a multiplication block 510 along with the compensated voltage constant 222. The output of the multiplication block 510 represents the internal battery voltage drop multiplied by the compensated voltage constant 222, which may be called a compensation factor. The output of the multiplication block 510 is passed to an addition block 512 with the ambient temperature correction factor 224. The output of the addition block 512 represents the sum of the ambient temperature correction factor 224 and the product of the internal battery voltage drop and the compensated voltage constant 222, which may be called a temperature corrected compensation factor. The output of the addition block 512 is provided as both inputs to a multiplication block 514 that produces an output corresponding to the square of the sum calculated by the addition block 512, which may be called a raised compensation factor. The compensated battery voltage drop calculation logic module 260 may include additional multiplication blocks to raise the sum to a higher power. The output of the multiplication block 514 is passed to another subtraction block 516 that subtracts it from the battery voltage 220. The output of the subtraction block 516 represents the compensated battery voltage and is outputted from the compensated battery voltage drop calculation logic module 260 through a lower output 518.

Referring again to FIG. 2, the upper output 508 of the compensated battery voltage drop calculation logic module 260 is used to set a battery voltage drop variable 262 that equals the internal battery voltage drop. The compensated battery voltage from the lower output 518 of the compensated battery voltage drop calculation logic module 260 and the normal battery voltage 228 are passed to a multiplexing device 264, along with the running battery test input 226. The output of the multiplexing device is 264 equals the compensated battery voltage if the running battery test input 226 is asserted (i.e., if the test is running) and the normal battery voltage 228 if the running battery test input 226 is not asserted (i.e., if the test is not running). The output of the multiplexing device 264 is used to set a variable 266 that represents the compensated battery voltage.

The recloser is alarmed or tripped when the voltage indicated by the variable 266 drops below threshold values that are lower than the normal battery voltage 228. Therefore, since the variable 266 is set to the normal battery voltage 228 when the battery is not being tested, the voltage indicated by the variable 266 is always greater than the threshold values when a battery test is not running, and the recloser is not alarmed or tripped when a battery test is not running. When a battery test is running, the recloser may be alarmed or tripped, depending upon the magnitude of the compensated battery voltage relative to the threshold values.

Figure 6:
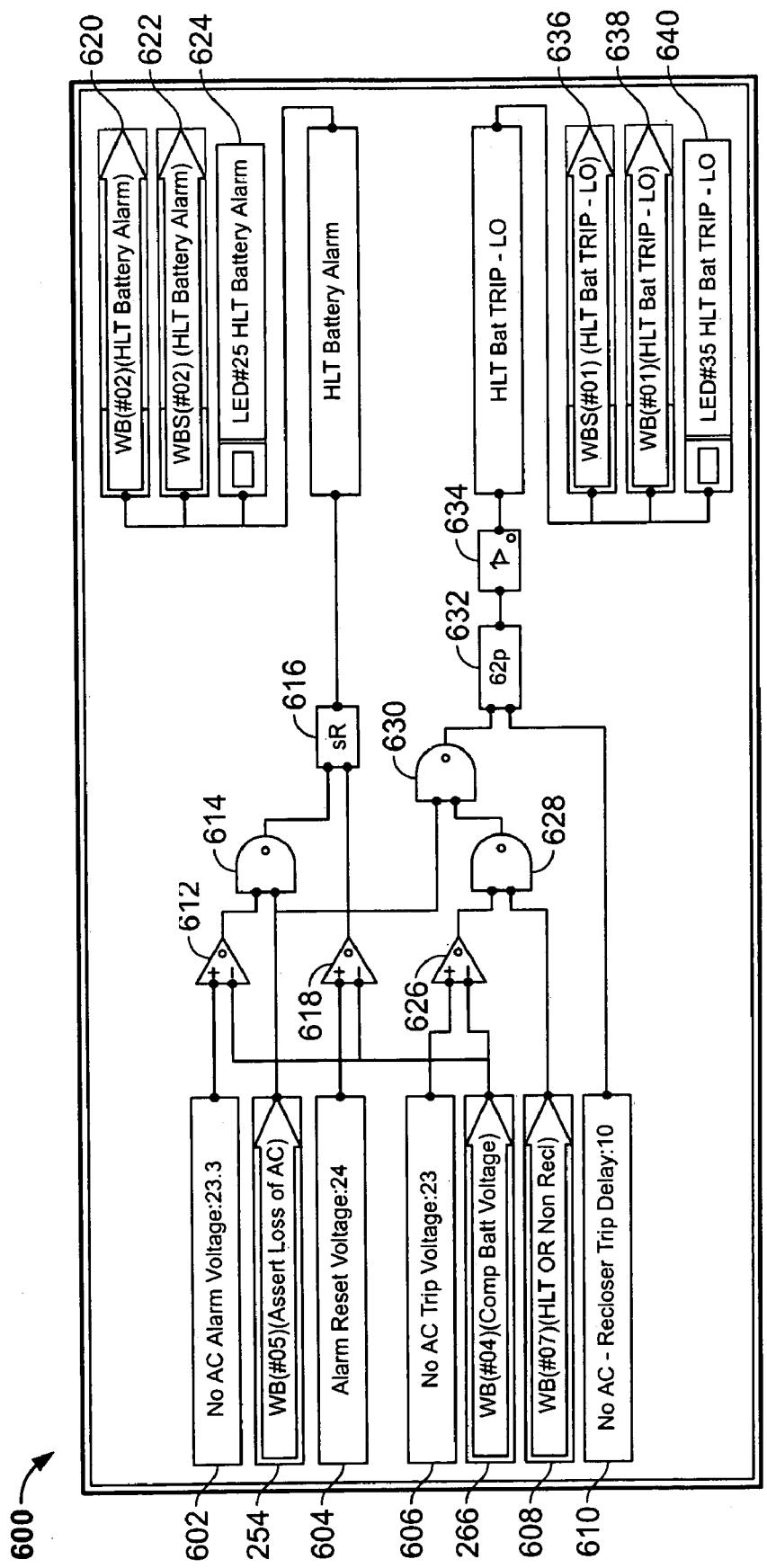
FIG. 6 is a block diagram of a logic module for alarming or tripping a recloser in response to a determined condition of a corresponding battery.

Referring to FIG. 6, an alarm and trip logic module 600 is used to determine whether an alarm indicating that failure of the battery may occur soon should be generated and whether the recloser should be tripped before the battery fails. The alarm and trip logic module 600 is a portion of the battery test logic module 125 of FIG. 1. The alarm and trip logic module 600 takes an alarm voltage 602, which represents a compensated battery voltage at or below which an alarm is issued to indicate that the battery may fail. In one implementation, the alarm voltage 602 is 23.3 V. The alarm and trip logic module 600 also takes an alarm reset voltage 604, which represents a compensated battery voltage at or above which alarms that have been issued are removed. In one implementation, the alarm reset voltage 604 is 24 V. The alarm and trip logic module 600 also takes a trip voltage 606 that represents a compensated battery voltage at or below which the recloser is tripped to prevent the battery from failing while the recloser is operating. In one implementation, the trip voltage 606 is 23 V.

The alarm and trip logic module 600 also takes as an input the compensated battery voltage variable 266 that has the value of the compensated battery voltage, as calculated by the compensated battery voltage drop calculation logic module 260 of FIG. 2. Other inputs to the alarm and trip logic module 600 are the variable 254, which indicates that power to the recloser has been lost, and a variable 608, which indicates whether one of the hot line tag input 212 or the non-reclosing input 214 is asserted. A trip delay 610 specifies an amount of time that must pass after the compensated battery voltage falls below the trip voltage 606 before a signal to trip the recloser is issued.

The alarm voltage 602 and the compensated battery voltage variable 266 are passed as inputs to a comparator 612. The output of the comparator 612 is asserted when the alarm voltage 602 is greater than the compensated battery voltage variable 266. In other words, the output of the comparator 612 is asserted when the compensated battery voltage is lower than the compensated battery voltage at or below which an alarm is issued. The output of the comparator 612 is passed to an AND gate 614, the second input of which is the power loss variable 254. The output of the AND gate 614 is asserted when the compensated voltage of the battery is below the alarm voltage 602 and power to the recloser has been lost.

The output of the AND gate 614 is used to set a non-volatile memory module 616 such that the output of the memory module 616 is asserted when the upper input from the AND gate 614 is asserted. The memory module 616 remains asserted until an asserted value is received on a reset input to the memory module 616 from a comparator 618. The comparator 618 is used to compare the alarm reset voltage 604 to the compensated battery voltage variable 266. The comparator 618 is asserted when the compensated voltage of the battery is greater than the alarm reset voltage 604. Therefore, the output of the memory module 616 is asserted when the AND gate 614 is asserted and becomes unasserted when the output of the comparator 618 becomes asserted.

The output of the memory module 616 is used to set a variable 620 that is used to issue an alarm to indicate that the compensated battery voltage is abnormally low but not so low as to be at risk of battery failure. The alarm may be detectable at other locations away from the recloser, such as a central utility control center, through use of the Supervisory Control and Data Acquisition (SCADA) protocol to transfer a signal indicative of the alarm to the other locations. When the output of the memory module 616 is asserted, the variable 620 is asserted and the alarm is issued.

The output of the memory module 616 also is used to set a variable 622 that is used to record a message indicating the time at which the alarm is issued. A recording module receives the variable 622 and records the time at which the variable 622 becomes asserted to record the time at which the alarm is issued. In addition, the output of the memory module 616 drives a LED 624 that is lit when the output of the memory module 616 is lit. Therefore, the LED 624 is lit when an alarm is sounded to indicate a dangerously low compensated battery voltage. In general, the alarm and the LED 624 are activated when the compensated voltage of the battery falls below the alarm voltage 602, and the alarm and the LED 624 are turned off when the compensated voltage of the battery rises above the alarm reset voltage 604.

The compensated battery voltage variable 266 is passed to a third comparator 626 for comparison with the trip voltage 606. The output of the comparator 626 is asserted when the compensated battery voltage variable 266 is less than the trip voltage 606. In other words, the output of the comparator 626 is asserted when the compensated battery voltage falls below a voltage at which the battery is at risk of failing soon.

The output of the comparator 626 is passed, along with the variable 608, to an AND gate 628. Therefore, the output of the AND gate 628 is asserted when the compensated battery voltage has fallen below the voltage at which the battery is at risk of failing and when the recloser may be tripped. The output of the AND gate 628 is passed to another AND gate 630 along with the variable 254, such that the output of the AND gate 630 is asserted when the compensated battery voltage has fallen below the voltage at which the battery is at risk of failing, the recloser may be tripped, and power to the recloser has been lost.

The output of the AND gate 630 is passed to an upper input of a pickup timer 632, and the trip delay 610 is passed to a lower input of the pickup timer 632. The output of the pickup timer 632 becomes asserted after an amount of time indicated by the time delay 610 has passed since the output of the AND gate 630 becomes asserted. The pickup timer 632 ensures that the recloser is in a state in which the recloser needs to be tripped to protect against an imminent battery failure for a requisite amount of time before signaling for the recloser to be tripped.

The output of the pickup timer 632 is provided to an edge detector 634, the output of which is asserted when the output of the pickup timer 632 becomes asserted. The output of the edge detector 634 is used to set a variable 636 that indicates that the recloser is to be tripped in advance of an imminent battery failure. When the output of the edge detector 634 is asserted, the variable 636 is asserted, and a signal to trip the recloser is issued. In this manner, the recloser is tripped before the battery voltage falls to a point at which the recloser would be prevented from being tripped in response to a fault due to shutdown of a microprocessor in the recloser or to insufficient battery energy to trip the recloser.

The output of the edge detector 634 also is used to set a variable 638 that is used to record a message indicating the time at which the recloser is tripped. A recording module receives the variable 638 and records the time at which the variable 622 becomes asserted to record the time at which the recloser is tripped. In addition, the output of the edge detector 634 drives LED 638 that is lit when the output of the edge detector 634 asserted (i.e., when the recloser is to be tripped in advance of battery failure). In general, the recloser is tripped and the LED 640 is lit when the compensated voltage of the battery falls below the trip voltage 606.

In addition to automatically issuing alarms and signals to trip the recloser based on the condition of the battery, text messages are used to inform utility personnel of the condition of the battery such that the utility personnel may take appropriate action. For example, the text messages may be displayed on an LCD screen on the recloser. Examples of messages that may be displayed to the utility personnel on the LCD screen are listed in Table 1 below. The messages in Table 1 are arranged in order of priority, with Message 1 having the highest priority, and requiring immediate attention, and Message 5 having the lowest priority.

TABLE 1

| Message Identifier | Message |
| --- | --- |
| Message 1 | HLT Battery TRIP<br>Check Condition of battery and charger for proper operation |
| Message 2 | HLT Battery Alarm<br>Check condition of battery and charger for proper operation |
| Message 3 | CHARGING BATTERY<br>Wait until battery OK LED goes ON before using battery |
| Message 4 | BAT VOLTAGE & CHG CURRENT ARE NORMAL<br>BAT VOLTAGE DROP IS HIGH, CHECK BATTERY |
| Message 5 | BATTERY IS FULLY CHARGED<br>Battery Condition is GOOD |

Figure 7:
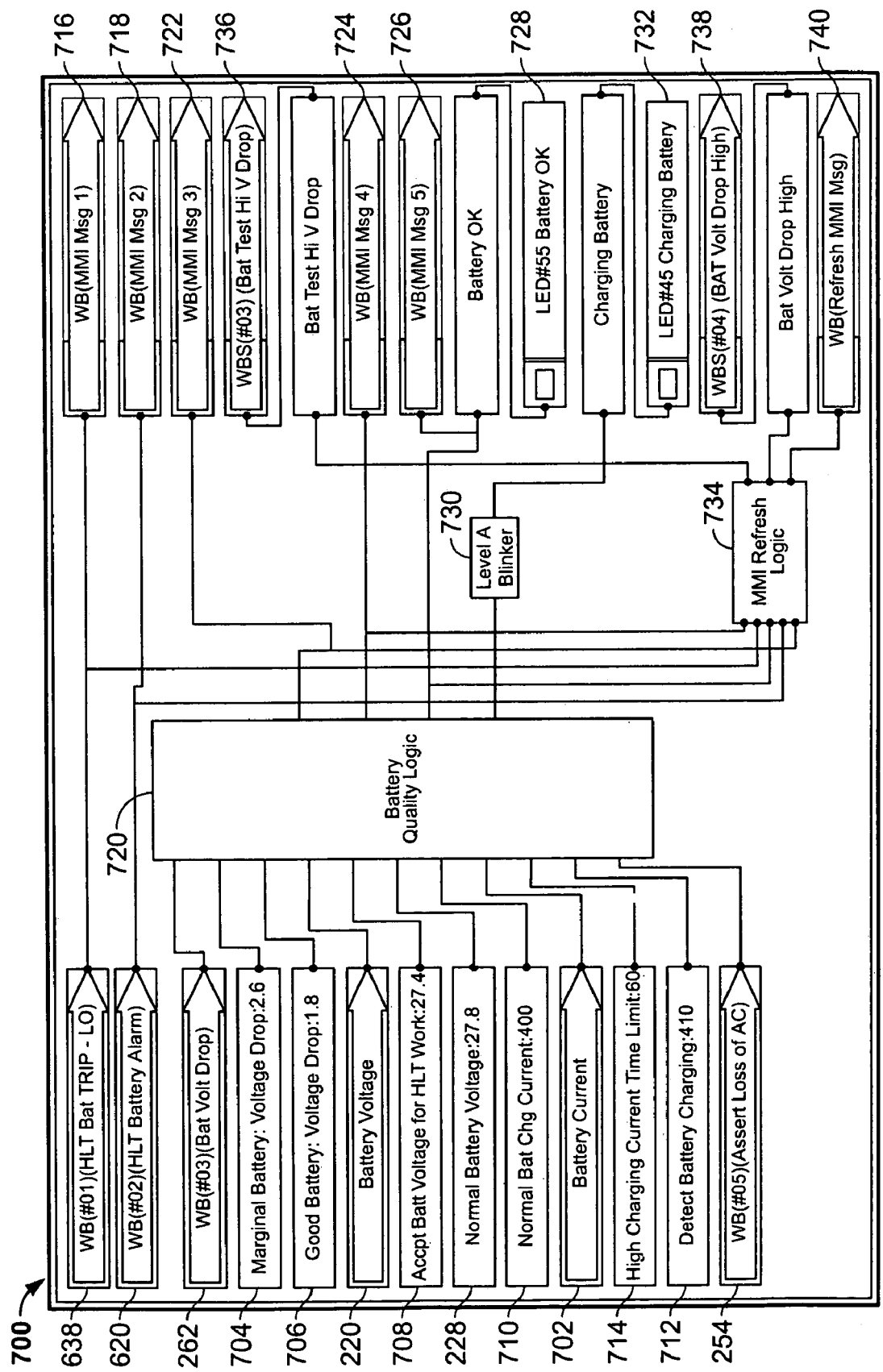
FIG. 7 is a block diagram of a logic module for generating messages that indicate the condition of a recloser battery.

Referring to FIG. 7, a user message logic module 700 identifies one of the messages listed in Table 1 as indicative of the current state of the battery and causes the identified message to be displayed for utility personnel. The user message logic module 700 is a portion of the battery test logic module 125 of FIG. 1. The inputs to the user message logic module 700 are the variable 620, which indicates that the current state of the battery warrants issuing an alarm, the variable 638, which indicates that the recloser should be tripped in advance of battery failure, the power loss variable 254, which indicates whether power to the recloser has been lost, and the battery voltage drop variable 262, which is a measurement of the internal voltage drop of the battery. In addition, the battery voltage 220 from the battery test identification logic module 200 and a battery current 702 also are provided to the user message logic module 700.

Other inputs to the user message logic module 700 are indications of good, normal, and acceptable battery operating conditions. For example, the normal battery voltage 228, which is 27.8 V in one implementation, is passed to the user message logic module 700. In addition, a marginal battery voltage drop 704, which is 2.6 V in one implementation, a good battery voltage drop 706, which is 1.8 V in one implementation, and an acceptable battery voltage 708, which is 27.4 V in one implementation, also are passed to the user message logic module 700. The user message logic module 700 also takes as inputs a normal battery charging current 710, which is 400 A in one implementation, a battery charging detection current 712, which is 410 mA in one implementation, and a high charging current time limit 714, which is 60 seconds in one implementation.

The variables 620 and 638 are used to directly set variables 716 and 718, respectively. The variable 716 indicates that Message 1 from Table 1 should be displayed when asserted, and the variable 718 indicates that Message 2 from Table 1 should be displayed when asserted. Therefore, Message 1 is displayed when the recloser is tripped in advance of battery failure, and Message 2 is displayed when an alarm is issued to indicate that the battery voltage is abnormally low.

All other inputs to the user message logic module 700 are passed to a battery quality logic module 720. More particularly, the battery voltage drop variable 262, the marginal battery voltage drop 704, the good battery voltage drop 706, the battery voltage 220, the acceptable battery voltage 708, the normal battery voltage 228, the normal battery charging current 710, the battery current 702, the high charging current time limit 714, the battery charging detection current 712, and the power loss variable 254 are passed to the battery quality logic module 720. The battery quality logic module 720 determines which of Message 3, Message 4, or Message 5 from Table 1 should be displayed and whether the battery is charging, and does so by comparing the various inputs to one another to identify a current state of the battery.

Figure 8:
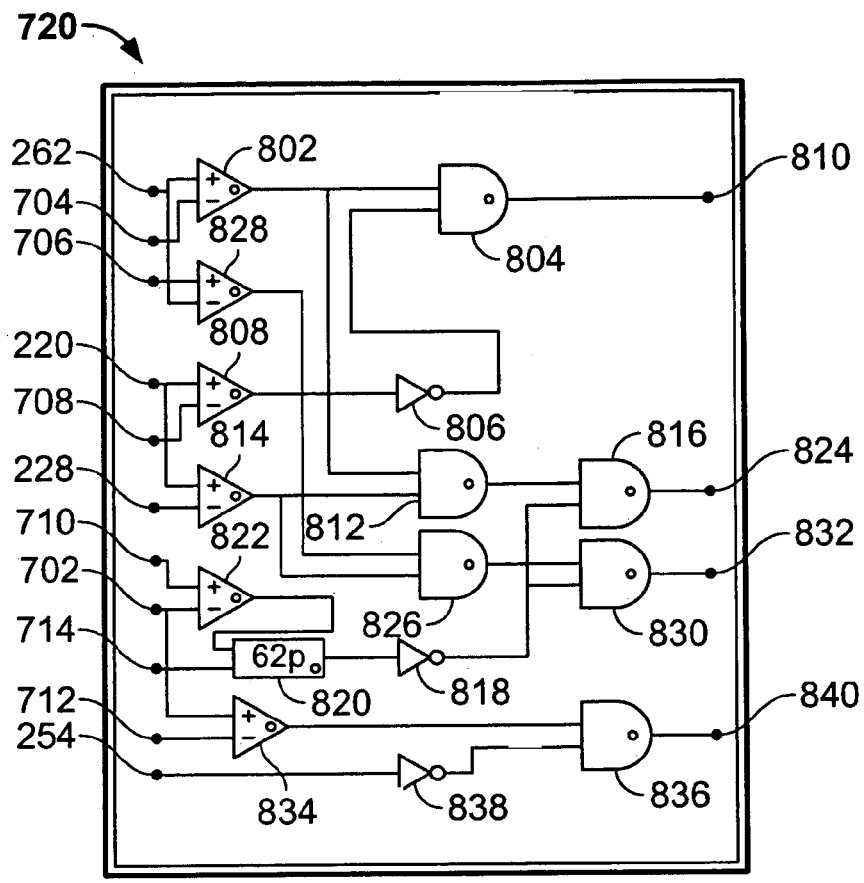
FIG. 8 is a block diagram of a logic module for determining the condition of a recloser battery.

Referring to FIG. 8, the battery quality logic module 720 includes a comparator 802 to which the battery voltage drop variable 262 and the marginal battery voltage drop 704 are passed. The output of the comparator 802, which is asserted when the battery voltage drop variable 262 is greater than the marginal battery voltage drop 704, is passed to an AND gate 804. The second input to the AND gate 804 is the output of a NOT gate 806 that negates the output of a comparator 808. The comparator 808 takes the battery voltage 220 and the acceptable battery voltage 708 as inputs and has an asserted output when the battery voltage 220 is greater than the acceptable battery voltage 708. The output of the AND gate 804 is connected to a first output 810 of the battery quality logic module 720 that is asserted when both the battery voltage drop variable 262 is greater than the marginal battery voltage drop 704 and the battery voltage 220 is less than the acceptable battery voltage 708.

The output of the comparator 802 is also passed to a second AND gate 812, the second input of which is the output of a comparator 814 that compares the battery voltage 220 and the normal battery voltage 228. The output of the comparator 814 is asserted when the battery voltage 220 is greater than the normal battery voltage 228. The output of the AND gate 812 is passed to another AND gate 816, the second input of which is the output of a NOT gate 818 that negates the output of a pickup timer 820. The output of a comparator 822 and the high charging current time limit 714 are the inputs to the pickup timer 820. The output of the pickup timer 820 becomes asserted after an amount of time equal to the high charging current time limit 714 has passed since the output of the comparator 822 has become asserted.

The normal battery charging current 710 and the battery current 702 are the inputs to the comparator 822, and the output of the comparator 822 is asserted when the normal battery charging current 710 is less than the battery current 702. The battery current 702 is less than the normal battery charging current 710 when the battery is fully charged. Consequently, the output of the AND gate 816 is asserted when the outputs of the comparators 802 and 814 are asserted before the output of the pickup timer 820 becomes asserted as a result of the output of the comparator 822 being asserted. In other words, the output of the AND gate 816 is asserted when the battery voltage 220 is greater than the normal battery voltage 228, the battery is fully charged, and the battery voltage drop variable 262 is greater than the marginal battery voltage drop 704. The output of the AND gate 816 is connected to a second output 824 of the battery quality logic module 720 that is asserted when the output of the AND gate 816 is asserted.

The output of the comparator 814 is provided as an input to an AND gate 826, the second input of which is the output of a comparator 828. The good battery voltage drop 706 and the battery voltage drop variable 262 are the inputs to the comparator 828, and the output of the comparator 828 is asserted when the good battery voltage drop 706 is greater than the battery voltage drop variable 262. As a result, the AND gate 826 is asserted when both the battery voltage 220 is greater than the normal battery voltage 228 and the battery voltage drop variable 262 is less than the good battery voltage drop 706.

The output of the AND gate 826 is passed to another AND gate 830, along with the output of the NOT gate 818. The output of the AND gate 830 is asserted when the output of the AND gate 826 is asserted before the output of the pickup timer 820 becomes asserted. In other words, the output of the AND gate 830 is asserted when the battery voltage drop variable 262 is less than the good battery voltage drop 706, the battery voltage 220 is greater than the normal battery voltage 228, and the battery current 702 indicates that the battery is not being charged. The output of the AND gate 830 is connected to a third output 832 of the battery quality logic module 735 that is asserted when the AND gate 830 is asserted.

The battery current 704 and the battery charging detection current 712 are passed to a comparator 834. The output of the comparator 834, which is asserted when the battery current 702 is greater than the battery charging detection current 712, is passed to an AND gate 836. The second input to the AND gate 836 is the output of a NOT gate 838 that negates the power loss variable 254. Consequently, the output of the AND gate 836 is asserted when both the battery current 702 is greater than the battery charging detection current and the recloser is being powered, which indicates that the battery is charging. The output of the AND gate 836 is passed to a fourth output 840 of the battery quality logic module 720 that is asserted when the AND gate 836 is asserted.

Referring again to FIG. 7, the first output 810 of the battery quality test logic module 720 is used to set a variable 722, which indicates that Message 3 from Table 1 should be displayed when the first output 810 is asserted. Therefore, Message 3 is displayed when the battery voltage is acceptable and the battery voltage drop is marginally high. The second output 824 of the battery quality test logic module 720 is used to set a variable 724, which indicates that Message 4 from Table 1 should be displayed when the second output 824 is asserted. Therefore, Message 4 is displayed when the battery voltage and the battery current are normal and the internal voltage drop of the battery is high. The third output 832 is used to set a variable 726 that indicates that Message 5 from Table 1 should be displayed when the third output 832 is asserted. Therefore, Message 5 is displayed when the battery quality logic module 720 has determined that the battery is fully charged and is in good condition. The third output 832 also drives a LED 728 that is asserted when the third output 832 is asserted such that the LED 728 is lit when Message 5 is displayed.

The fourth output 840 of the battery quality logic module 720, which indicates that the battery is being charged, is passed to a blinker 730. When the fourth output 840 is asserted, the output of the blinker 730 alternates between being asserted and unasserted. When the fourth output 840 is unasserted, the output of the blinker 730 remains unasserted. The output of the blinker 730 drives a LED 732. Therefore, the LED alternates between being on and off, or blinks, when the battery is being charged.

The first output 810, the second output 824, and the third output 832 of the battery quality logic module 720, as well as the variables 620 and 638, are passed to a display refresh logic module 734. The display refresh logic module 734 determines when the display on which Messages 1-5 are presented needs to be refreshed because the message to be displayed has changed. The five inputs to the display refresh logic module 734 correspond to the signals used to set the variables (716, 718, 722, 724, and 726) that indicate which of the Messages 1-5 are to be displayed. Therefore, the display refresh logic module 734 indicates that the display should be refreshed when one of five inputs becomes asserted.

Figure 9:
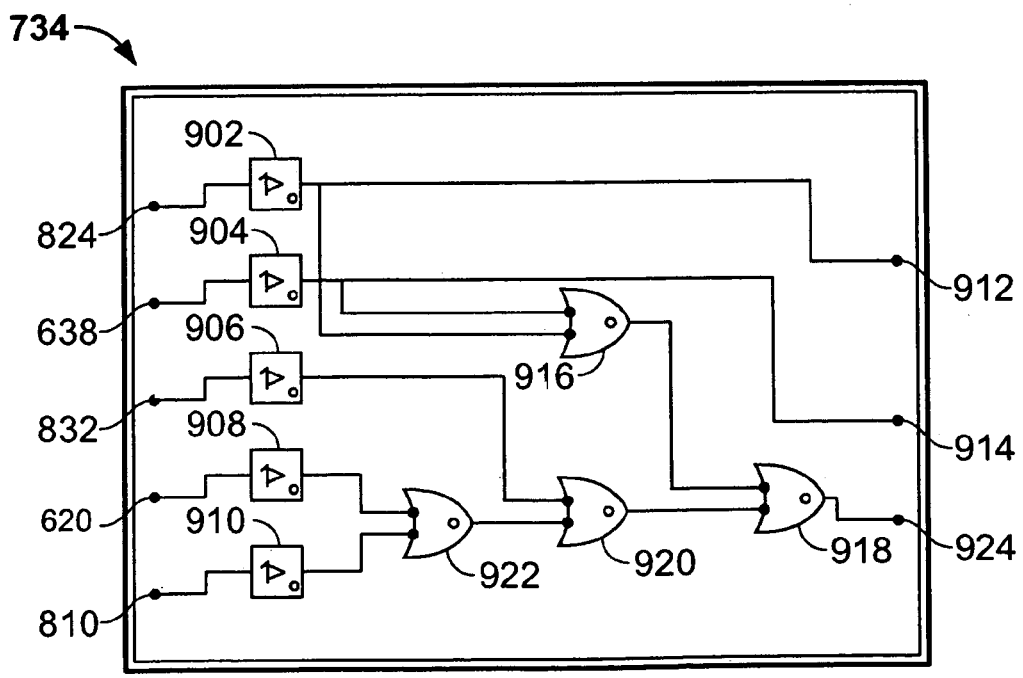
FIG. 9 is a block diagram of a logic module for signaling for a display of recloser battery condition to be refreshed.

Referring also to FIG. 9, each of the five inputs to the display refresh logic module 734 is provided to an edge detector. More particularly, the second output 824 is provided to an edge detector 902, the variable 638 is provided to an edge detector 904, the third output 832 is provided to an edge detector 906, the variable 620 is provided to an edge detector 908, and the first output 810 is provided to edge detector 910. The output of the edge detector 902 is passed to a first output 912 of the display refresh logic module 734 that is asserted when the battery voltage and charging current are normal and when the internal voltage drop of the battery is high. The output of the edge detector 904 is passed to a second output 914 of the display refresh logic module 734 that is asserted when the recloser has been tripped due to a high internal battery voltage drop that indicates that the battery may fail.

The outputs of the edge detectors 902 and 904 are also sent to an OR gate 916, the output of which is passed to another OR gate 918 whose second input is the output of another OR gate 920. The inputs to the OR gate 920 are the outputs of the edge detector 906 and of a fourth OR gate 922. The inputs to the OR gate 922 are the outputs of the edge detectors 908 and 910. The output of the OR gate 912 is connected to a third output 924 of the display refresh logic module 734. Therefore, the output 924 of the display refresh logic module 734 is asserted when one of the five inputs to the display refresh logic module 734 is asserted, or in other words, when one of the Messages 1-5 from Table 1 is identified for display.

Referring again to FIG. 7, the first output 912 of the display refresh logic module 734 is used to set a variable 736 that indicates that the internal voltage drop of the battery is high even though the battery voltage and charging current are normal. Similarly, the second output 914 of the display refresh logic module 734 is used to set a variable 738 that indicates that the internal voltage drop of the battery is high enough to necessitate tripping the recloser in advance of battery failure. A recording module receives the variables 736 and 738 and records the times at which the variables 736 and 738 become asserted to record when the internal voltage drop of the battery is high. The third output 924 is used to set a variable 740 that indicates that the display is to be refreshed. The variable 740 and the message variables 716, 718, 722, 724, and 726 are used to refresh the display with an appropriate message that indicates the current condition of the battery. The variables 716, 718, 722, 724, and 726 are mutually exclusive in that only one of the variables 716, 718, 722, 724, and 726 is asserted at a time, so only one message is signaled for display at a time. For example, if the variables 716 and 740 are asserted, then the display is refreshed to present Message 1 from Table 1.

In the implementations described above, internal battery voltage drop, battery voltage, and ambient temperature are used to determine whether a battery is of a sufficient quality to power operation of a corresponding recloser in the event of failure of an AC power source typically used by the recloser. However, in other implementations, discharge current of the battery may be included when calculating the compensated battery voltage to determine whether the battery may power operation of the recloser. In addition, the drain of the microprocessor control on the battery may be included in the calculation of the compensated battery voltage.

It will be understood that various modifications may be made without departing from the spirit and scope of the claims. For example, advantageous results still could be achieved if steps of the disclosed techniques were performed in a different order and/or if components in the disclosed systems were combined in a different manner and/or replaced or supplemented by other components. Accordingly, other implementations are within the scope of the following claims.

What is claimed is:

1. A method for automatically removing an automatic circuit recloser from service prior to battery failure, the method comprising:
   determining, using logic implemented on an automatic circuit recloser, whether a battery of the automatic circuit recloser may power operation of the automatic circuit recloser in place of a primary power source of the automatic circuit recloser; and
   signaling, using the logic, for the automatic circuit recloser to be tripped automatically when the battery may not power operation of the automatic circuit recloser in place of the primary power source.

2. The method of claim 1 wherein determining whether the battery may power operation of the automatic circuit recloser comprises:
   calculating a compensated voltage for the battery;
   comparing the compensated voltage to a trip voltage that represents the compensated voltage at or below which the battery may not power operation of the automatic circuit recloser; and
   determining that the battery may not power operation of the automatic circuit recloser when the compensated voltage for the battery is less than the trip voltage.

3. The method of claim 2 wherein calculating the compensated voltage for the battery comprises:
   measuring a voltage for the battery;
   measuring an internal voltage drop for the battery; and
   multiplying the measured internal voltage drop by a compensated voltage constant to produce a compensation factor; and
   subtracting the compensation factor from the measured voltage to produce the compensated voltage.

4. The method of claim 3 wherein subtracting the compensation factor from the measured voltage comprises:
   raising the compensation factor to a whole number power to produce a raised compensation factor; and
   subtracting the raised compensation factor from the measured voltage to produce the compensated voltage.

5. The method of claim 3 wherein subtracting the compensation factor from the measured voltage comprises:
   adding an ambient temperature correction factor to the compensation factor to produce a temperature corrected compensation factor;
   raising the temperature corrected compensation factor to a whole number power to produce a raised compensation factor; and
   subtracting the raised compensation factor from the measured voltage to produce the compensated voltage.

6. The method of claim 5 further comprising determining, using the logic, the ambient temperature correction factor based on an ambient temperature to which the automatic circuit recloser is exposed.

7. The method of claim 1 further comprising waiting, using the logic, for a trip delay amount of time after determining that the battery may not power operation of the automatic circuit recloser and before signaling for the automatic circuit recloser to be tripped.

8. The method of claim 1 further comprising:
   determining, using the logic, whether the battery is of a marginal quality in which the capability of the battery to power operation of the automatic circuit recloser is compromised; and
   issuing, using the logic, an alarm to indicate that the battery is of the marginal quality.

9. The method of claim 8 wherein determining whether the battery is of the marginal quality comprises:
   calculating a compensated voltage for the battery;
   comparing the compensated voltage to an alarm voltage that indicates a compensated voltage at or below which an alarm indicating that the battery is of the marginal quality is issued; and
   issuing an alarm when the compensated voltage is less than the alarm voltage.

10. The method of claim 9 further comprising:
    comparing, using the logic, the compensated voltage to an alarm reset voltage that represents a minimum compensated voltage at which an alarm that has been issued is removed; and
    removing, using the logic, an alarm that has been issued when the compensated voltage is greater than the alarm reset voltage.

11. The method of claim 8 further comprising
    determining, using the logic, whether the automatic circuit recloser is performing a protective action in response to a fault; and
    preventing, using the logic, an alarm that indicates that the battery is of the marginal quality from being issued when the automatic circuit recloser is performing a protective action in response to a fault.

12. The method of claim 1 further comprising
    determining, using the logic, whether the automatic circuit recloser is performing a protective action in response to a fault; and
    preventing, using the logic, a signal for the automatic circuit recloser to be tripped automatically from being issued when the automatic circuit recloser is performing a protective action in response to a fault.

13. The method of claim 1 wherein determining whether the battery may power operation of the automatic circuit recloser comprises:
    determining whether a previous determination as to whether the battery may power operation of the automatic circuit recloser has been made at a time within a minimum amount of time between tests of the battery from the present time; and
    determining whether the battery may power operation of the automatic circuit recloser when a previous determination as to whether the battery may power operation of the automatic circuit recloser has not been made at a time within the minimum amount of time between tests of the battery from the present time.

14. The method of claim 1 wherein determining whether the battery may power operation of the automatic circuit recloser comprises:
    determining whether a hot line tag has been applied to the automatic circuit recloser; and
    determining whether the battery may power operation of the automatic circuit recloser when the hot line tag has been applied to the automatic circuit recloser.

15. The method of claim 1 wherein determining whether the battery may power operation of the automatic circuit recloser comprises:
    determining whether a non-reclosing tag has been applied to the automatic circuit recloser; and
    determining whether the battery may power operation of the automatic circuit recloser when the non-reclosing tag has been applied to the automatic circuit recloser.

16. The method of claim 1 wherein determining whether the battery may power operation of the automatic circuit recloser comprises:
    determining whether the automatic circuit recloser has been energized;

determining a time at which the automatic circuit recloser was energized; and determining whether the battery may power operation of the automatic circuit recloser when the time at which the automatic circuit recloser was energized is not within a minimum amount of time after recloser energization from the present time.

17. The method of claim 1 wherein determining whether the battery may power operation of the automatic circuit recloser comprises:

determining whether the power source has failed;

determining whether the power source failed at a time within a power loss time delay from the present time; and determining whether the battery may power operation of the automatic circuit recloser when the power source failed at a time that is not within a power loss time delay from the present time.

18. The method of claim 1 further comprising:

determining, using the logic, a quality of the battery by comparing measurements of parameters that describe the quality of the battery to values of the parameters that are indicative of a good quality battery; and signaling, using the logic, for the display of information describing the quality to an operator of the automatic circuit recloser.

19. The method of claim 18 wherein signaling for the display of information describing the quality comprises:

identifying a text message describing the quality of the battery; and signaling for the display of the text message on a liquid crystal display screen that is viewed by the operator.

20. The method of claim 19 further comprising signaling, using the logic, for the liquid crystal display screen to be refreshed when a new text message to be displayed is identified.

21. The method of claim 18 wherein signaling for the display of information describing the quality comprises lighting one or more light emitting diodes to indicate the quality of the battery to the operator.

22. The system of claim 21 wherein the logic implemented on the automatic circuit recloser is included in a scratch logic portion of the recloser.

23. The system of claim 21 wherein the logic implemented on the automatic circuit recloser is included in a base logic portion of the recloser.

24. The system of claim 21 wherein the electrical system is a transmission circuit.

25. The system of claim 21 wherein the electrical system is an electrical substation.

26. A system for automatically removing an automatic circuit recloser from service prior to battery failure, the system comprising:

an automatic circuit recloser connected to an electrical system that protects the electrical system from damage due to faults on the electrical system;

logic implemented on the automatic circuit recloser for determining whether a battery of the automatic circuit recloser may power operation of the automatic circuit recloser in place of a primary power source of the automatic circuit recloser; and logic implemented on the automatic circuit recloser for signaling for the automatic circuit recloser to be tripped automatically when the battery may not power operation of the automatic circuit recloser in place of the primary power source.

27. The system of claim 26 wherein the logic for determining whether the battery may power operation of the automatic circuit recloser comprises:

logic for calculating a compensated voltage for the battery;

logic for comparing the compensated voltage to a trip voltage that represents the compensated voltage at or below which the battery may not power operation of the automatic circuit recloser; and logic for determining that the battery may not power operation of the automatic circuit recloser when the compensated voltage for the battery is less than the trip voltage.

28. The system of claim 27 wherein the logic for calculating the compensated voltage for the battery comprises:

logic for measuring a voltage for the battery;

logic for measuring an internal voltage drop for the battery; and logic for multiplying the measured internal voltage drop by a compensated voltage constant to produce a compensation factor; and logic for subtracting the compensation factor from the measured voltage to produce the compensated voltage.

29. The system of claim 28 wherein the logic for subtracting the compensation factor from the measured voltage comprises:

logic for raising the compensation factor to a whole number power to produce a raised compensation factor; and logic for subtracting the raised compensation factor from the measured voltage to produce the compensated voltage.

30. The system of claim 28 wherein the logic for subtracting the compensation factor from the measured voltage comprises:

logic for adding an ambient temperature correction factor to the compensation factor to produce a temperature corrected compensation factor;

logic for raising the temperature corrected compensation factor to a whole number power to produce a raised compensation factor; and logic for subtracting the raised compensation factor from the measured voltage to produce the compensated voltage.

31. The system of claim 30 further comprising logic implemented on the automatic circuit recloser for determining the ambient temperature correction factor based on an ambient temperature to which the automatic circuit recloser is exposed.

32. The system of claim 26 further comprising logic implemented on the automatic circuit recloser for waiting for a trip delay amount of time after determining that the battery may not power operation of the automatic circuit recloser and before signaling for the automatic circuit recloser to be tripped.

33. The system of claim 26 further comprising:

logic implemented on the automatic circuit recloser for determining whether the battery is of a marginal quality in which the capability of the battery to power operation of the automatic circuit recloser is compromised; and logic implemented on the automatic circuit recloser for issuing an alarm to indicate that the battery is of the marginal quality.

34. The system of claim 33 wherein the logic for determining whether the battery is of the marginal quality comprises:

logic for calculating a compensated voltage for the battery;

logic for comparing the compensated voltage to an alarm voltage that indicates a compensated voltage at or below which an alarm indicating that the battery is of the marginal quality is issued; and logic for issuing an alarm when the compensated voltage is less than the alarm voltage.

35. The system of claim 34 further comprising:
logic implemented on the automatic circuit recloser for comparing the compensated voltage to an alarm reset voltage that represents a minimum compensated voltage at which an alarm that has been issued is removed; and
logic implemented on the automatic circuit recloser for removing an alarm that has been issued when the compensated voltage is greater than the alarm reset voltage.

36. The system of claim 33 further comprising
logic implemented on the automatic circuit recloser for determining whether the automatic circuit recloser is performing a protective action in response to a fault; and
logic implemented on the automatic circuit recloser for preventing an alarm that indicates that the battery is of the marginal quality from being issued when the automatic circuit recloser is performing a protective action in response to a fault.

37. The system of claim 26 further comprising
logic implemented on the automatic circuit recloser for determining whether the automatic circuit recloser is performing a protective action in response to a fault; and
logic implemented on the automatic circuit recloser for preventing a signal for the automatic circuit recloser to be tripped automatically from being issued when the automatic circuit recloser is performing a protective action in response to a fault.

38. The system of claim 26 wherein the logic for determining whether the battery may power operation of the automatic circuit recloser comprises:
logic for determining whether a previous determination as to whether the battery may power operation of the automatic circuit recloser has been made at a time within a minimum amount of time between tests of the battery from the present time; and
logic for determining whether the battery may power operation of the automatic circuit recloser when a previous determination as to whether the battery may power operation of the automatic circuit recloser has not been made at a time within the minimum amount of time between tests of the battery from the present time.

39. The system of claim 26 wherein the logic for determining whether the battery may power operation of the automatic circuit recloser comprises:
logic for determining whether a hot line tag has been applied to the automatic circuit recloser; and
logic for determining whether the battery may power operation of the automatic circuit recloser when the hot line tag has been applied to the automatic circuit recloser.

40. The system of claim 26 wherein the logic for determining whether the battery may power operation of the automatic circuit recloser comprises:

logic for determining whether a non-reclosing tag has been applied to the automatic circuit recloser; and
logic for determining whether the battery may power operation of the automatic circuit recloser when the non-reclosing tag has been applied to the automatic circuit recloser.

41. The system of claim 26 wherein the logic for determining whether the battery may power operation of the automatic circuit recloser comprises:
logic for determining whether the automatic circuit recloser has been energized;
logic for determining a time at which the automatic circuit recloser was energized; and
logic for determining whether the battery may power operation of the automatic circuit recloser when the time at which the automatic circuit recloser was energized is not within a minimum amount of time after recloser energization from the present time.

42. The system of claim 26 wherein the logic for determining whether the battery may power operation of the automatic circuit recloser comprises:
logic for determining, whether the power source has failed;
logic for determining, whether the power source failed at a time within a power loss time delay from the present time; and
logic for determining whether the battery may power operation of the automatic circuit recloser when the power source failed at a time that is not within a power loss time delay from the present time.

43. The system of claim 26 further comprising:
logic implemented on the automatic circuit recloser for determining a quality of the battery by comparing measurements of parameters that describe the quality of the battery to values of the parameters that are indicative of a good quality battery; and
logic implemented on the automatic circuit recloser for signaling for the display of information describing the quality to an operator of the automatic circuit recloser.

44. The system of claim 43 wherein the logic for signaling for the display of information describing the quality comprises:
logic for identifying a text message describing the quality of the battery; and
logic for signaling for the display of the text message on a liquid crystal display screen that is viewed by the operator.

45. The system of claim 44 further comprising logic implemented on the automatic circuit recloser for signaling for the liquid crystal display screen to be refreshed when a new text message to be displayed is identified.

46. The system of claim 43 wherein the logic for signaling for the display of information describing the quality comprises logic for lighting one or more light emitting diodes to indicate the quality of the battery to the operator.

* * * * *